United States Patent [19]

Hipps, Sr. et al.

[11] Patent Number: 4,957,843
[45] Date of Patent: Sep. 18, 1990

[54] PREVENTION OF SHORT TIME SCALE RECIPROCITY FAILURE BY VISCOSITY CONTROL

[75] Inventors: Jesse Hipps, Sr., Miamisburg; Amy L. Burkholder, Kettering, both of Ohio

[73] Assignee: The Mead Corporation, Dayton, Ohio

[21] Appl. No.: 420,632

[22] Filed: Oct. 5, 1989

Related U.S. Application Data

[63] Continuation of Ser. No. 255,907, Oct. 11, 1988, abandoned.

[51] Int. Cl.$^5$ .............................................. G03C 1/72
[52] U.S. Cl. .................................... 430/138; 430/281; 430/288; 430/293; 430/253; 522/74
[58] Field of Search ............... 430/138, 915, 927, 270, 430/281, 293, 288; 522/74

[56] References Cited

U.S. PATENT DOCUMENTS

| | | | |
|---|---|---|---|
| 3,899,611 | 8/1975 | Hall | 427/54 |
| 3,925,076 | 12/1975 | Heimsch et al. | 430/292 |
| 4,138,300 | 2/1979 | Kaetsu et al. | |
| 4,218,294 | 8/1980 | Brack | 522/74 |
| 4,399,209 | 8/1983 | Sanders et al. | 430/138 |
| 4,482,624 | 11/1984 | Arney et al. | 430/138 |
| 4,751,165 | 6/1988 | Rourke et al. | 430/138 |
| 4,760,011 | 7/1988 | Kakimi | 430/138 |
| 4,788,124 | 11/1988 | Wright | 430/138 |
| 4,804,611 | 2/1989 | Geis | 430/138 |
| 4,840,866 | 6/1989 | Kovacs et al. | 430/927 |
| 4,882,259 | 11/1989 | OConnor et al. | 430/281 |

FOREIGN PATENT DOCUMENTS 2163563 8/1985 United Kingdom ................ 430/138

OTHER PUBLICATIONS

Journal of Imaging Science, "Oxidation Kinetics and Reciprocity Behavior in the Microencapsulated Acrylate Imaging Process", J. S. Arney, pp. 27-30, 1987.

*Primary Examiner*—Marion C. McCamish
*Assistant Examiner*—Christopher D. RoDee
*Attorney, Agent, or Firm*—Thompson, Hine and Flory

[57] ABSTRACT

A photosensitive composition resistant to short time scale reciprocity failure is disclosed. The composition comprises microcapsules having an internal phase containing an image forming agent; a photohardenable composition comprising a free radical addition polymerizable or crosslinkable compound and a photoinitiator; and a viscosity modifier for increasing the viscosity of said internal phase.

14 Claims, 1 Drawing Sheet

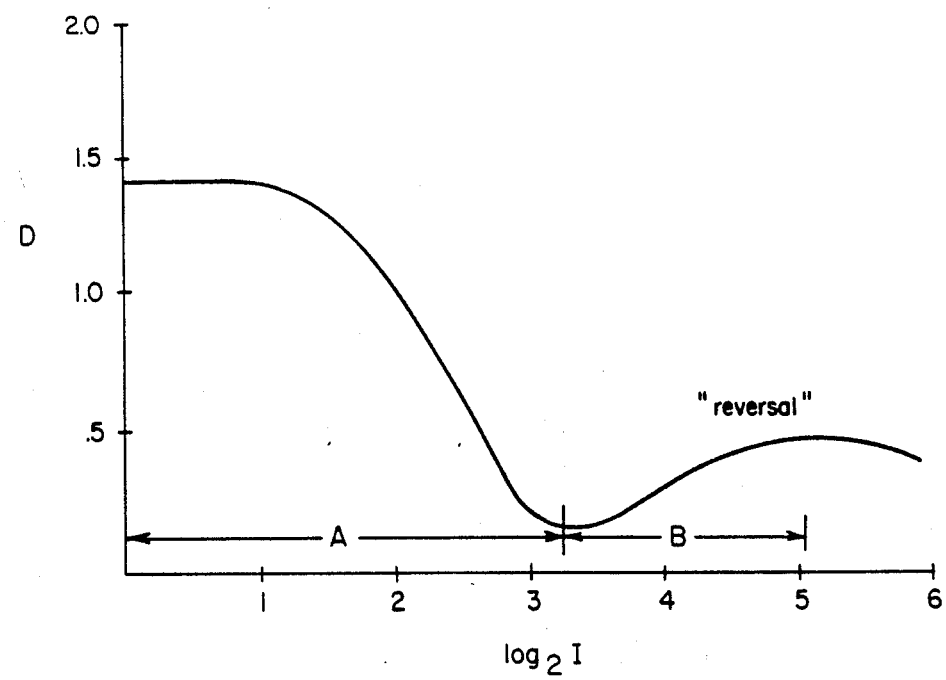

PREVENTION OF SHORT TIME SCALE RECIPROCITY FAILURE BY VISCOSITY CONTROL

This is a continuation of co-pending application Ser. No. 255,907, filed Oct. 11, 1988, now abandoned.

BACKGROUND OF THE INVENTION

1. Field of the Invention

The present invention relates to a positive working imaging process employing photosensitive microcapsules. More particularly, the present invention utilizes viscosity control by addition of a viscosity modifier to the internal phase of the microcapsules to cause the microcapsules to be less susceptible to the reversal phenomenon caused by short time scale reciprocity failure.

2. Description of the Prior Art

Photosensitive imaging systems employing microencapsulated radiation sensitive compositions are the subject of commonly assigned U.S. Pat. Nos. 4,399,209 and 4,440,846 to The Mead Corporation as well as copending U.S. patent application Ser. No. 320,643 filed Jan. 18, 1982. These imaging systems are characterized in that an imaging sheet including a layer of microcapsules containing a photosensitive composition in the internal phase is image-wise exposed to actinic radiation. In the most typical embodiments, the photosensitive composition is a photopolymerizable composition including a polyethylenically unsaturated compound and a photoinitiator and is encapsulated with a color precursor. Image-wise exposure hardens the internal phase of the microcapsules as a result of the photoinitiator generating free radicals which initiate polymerization of the polyethylenic unsaturated compound by free radical addition polymerization. Following exposure, the imaging sheet is subjected to a uniform rupturing force by passing the sheet through the nip located between a pair of pressure rollers.

U.S. Pat. No. 4,399,209 discloses a transfer system in which the imaging sheet is assembled with a developer sheet prior to being subjected to the rupturing force. Upon passing through the pressure rollers in contact with the developer sheet, the microcapsules rupture and image-wise release the internal phase whereupon the color-former migrates to the developer sheet where it reacts with a dry developer and forms a color image. The imaging system can be designed to reproduce monochromatic or polychromatic full color images.

U.S. Pat. No. 4,440,846 discloses a so called "self-contained" imaging system wherein both the image-forming agent and the developer material are located on the same substrate. In the system according to U.S. Pat. No. 4,440,846, the image-forming agent is encapsulated in a layer of pressure rupturable capsules, and the subsequent exposure and capsule rupture causes the image-forming agent to contact and react with the developer to produce an image on the substrate.

Although such systems have provided a significant advance in the art, the systems still suffer from a number of minor drawbacks. One such drawback mandates the use of lower intensity radiation sources for longer periods of time. This is due to a phenomenon known as short time scale reciprocity failure and it has limited the use of the systems with certain high intensity light sources, such as lasers and in high speed copying.

At time scales less than 0.1 seconds, two types of reciprocity failure have been observed to occur with various types of photosensitive material. Failure of the first type occurs around .001 seconds for most systems and results in a progressive loss of sensitivity down to about 1 microsecond. The total loss at 1 microsecond, compared to 1 second, is expected to be about a factor of 10 for most systems. Whether further losses below the microseconds level occur by this type of failure is not known. The mechanistic cause of the failure is a chemical inefficiency due to high concentrations of free radicals. The radicals react with each other rather than doing the chemistry expected of them.

The second type of failure at short time scales is found in a few types of photosensitive materials. When this type of failure occurs, it is quite severe, causing an instant loss of a factor of 10 in sensitivity. This catastrophic loss has been observed to occur in different systems ranging from seconds to microseconds regions.

Most scientists who deal with photographic materials are familiar with the "H & D" (D log H) curve. The H & D curve characterizes the way in which a photographic material responds to light. An H & D curve is shown in the FIGURE. If the system is "well behaved," the H & D curve teaches the scientists about the energy and contrast (grey scale) requirements of an exposure device. This region is represented by A on the FIGURE. In other areas, as is represented by B on the FIGURE, the imaging system is not well behaved and results in the H&D curve not being the same in all conditions. The region represented by B is the "reversal region" and depicts the second type of failure referred to above (i.e., short time scale reciprocity failure).

Without considering short time scale reciprocity failure, for a given photosensitive material the degree of polymerization is principally a function of exposure (i.e., the photosensitive material will polymerize upon exposure to at least a minimum amount of radiation). Exposure may be quantitatively expressed as a product of the intensity of the radiation source and the time of exposure. Accordingly, these two variables can be appropriately manipulated to provide a given exposure. In theory, as long as the desired exposure is obtained by any manipulation of intensity and time, a predetermined amount of polymerization should occur.

In short time scale reciprocity failure, the rate of polymerization slows to a point at which the photohardenable composition never fully polymerizes. When the photohardenable composition is microencapsulated and used in the aforementioned imaging systems, the system is unable to reach Dmin.

The reversal phenomenon varies widely amongst systems containing photosensitive materials. For some systems, reversal can occur only when subjecting the photosensitive composition to intensities and exposure times which cannot practically be achieved using present technology. For these systems short time scale reciprocity failure does not pose a serious problem. For other systems, short time scale reciprocity failure can pose a problem which must be overcome to enable the production of images. The problems are particularly apparent in systems which are subjected to high intensity amounts of radiation for short periods of time.

While not wishing to be bound by any particular theory, it is believed that short time scale reciprocity failure is in large part a function of the monomer used and the type and concentration of the photoinitiator. In systems where noticeable short time scale reciprocity failure occurs, it is hypothesized that termination reactions occur at a faster rate than the propagation reactions as a result of either the photoinitiator being depleted in the microcapsules before the monomer has had an opportunity to polymerize, or by the creation of a polymerization inhibitor or a radical scavenger in the microcapsules. Moreover, once the photosensitive material has encountered failure as a result of "reversal," the reversal effect cannot be overcome.

For some photosensitive materials, it has been difficult, if not impossible, to develop a system utilizing high intensity short time scale exposures because of the risk of reversal. When utilizing photopolymerizable systems as described above for copying documents, it is desirable to minimize the time of exposure. By maintaining a short exposure time, copies can be produced at a faster rate. To prevent reversal in systems which exhibit noticeable short time scale reciprocity failure, lower intensity radiation sources, and accordingly, longer exposure times are required to produce images. Accordingly, the number of copies produced per minute in such systems have been limited.

In addition, it has long been desired to utilize high intensity sources, such as lasers as light sources for photosensitive imaging systems because of their monochromatic spectral characteristics and their ability to be easily controlled, such as by computer control as is known in the art. The use of lasers has been limited in some photosensitive systems as the high intensities of the lasers have caused some photosensitive materials to reverse as a result of short time scale failure.

Thus, there exists a need in the art for a photosensitive composition which is less susceptible to reversal upon exposure to high intensity radiation, and thereby enables the production of a large number of copies per minute and the use of high intensity radiation sources.

DEFINITIONS

The term "reversal time" refers to the exposure time for a given exposure (E) (where E equals intensity (I) × Time (t)) below which the photosensitive material is unable to reach Dmin. At exposure times greater than the reversal time for a given exposure (I×t), Dmin is reached, i.e., the photosensitive material obeys reciprocity and does not exhibit reversal (we assume in this discussion that exposure times do not become so great that another mechanistic phenomenon known as long time scale reciprocity failure occurs. See Arney, "Oxidation Kinetics and Reciprocity Behavior in the Microencapsulated Acrylate Imaging Process," *J. Imaging Science* 31:27-30 (1987)). Increases in intensity for exposure time periods less than the reversal time produces proportional increases in image density.

SUMMARY OF THE INVENTION

In accordance with the present invention, a photosensitive composition resistant to short time scale reciprocity failure is disclosed. The composition utilizes viscosity control to shorten the reversal time of the composition and thereby enable the use of high intensity, short time exposures. While not completely understood, the addition of the viscosity modifier alters the chemical properties of the internal phase to reduce the reversal time of the composition.

For purposes of this invention, the tendency for a composition to undergo reversal is expressed as its reversal time. Assuming that the exposure required for polymerization is a given value, and that the intensity of the radiation source is constant, the exposure time of the photosensitive material to the radiation source may be easily determined by dividing the exposure by the intensity of the radiation source. If the exposure time is greater than the reversal time, the photosensitive material obeys reciprocity and does not reverse. If the exposure time is less than the reversal time, the photosensitive material is subject to the reversal phenomenon and does not obey reciprocity. In the present invention, reversal time is shortened thus enabling higher intensity, short time scale radiation sources such as commercially available lasers to be utilized. If the photosensitive material is utilized to produce copies, more copies per minute can be produced. The inventors have discovered that the reversal time for a material can be shortened by adding a viscosity modifier to the internal phase of the material which increases the viscosity of the material.

The relationship between the viscosity of the internal phase and the reversal time is explained in the following hypothetical example. If the theoretical exposure required for polymerization of a material is 2000 erg/cm$^2$ and the radiation source selected delivers energy at an intensity of 1000 erg/sec. cm$^2$, the source must be activated for 2 seconds to effectuate polymerization. If the reversal time for the hypothetical material is 4 seconds, the reversal phenomenon will set in as the reversal time is greater than the exposure time and the composition will either not polymerize or will polymerize at a much slower rate than expected. According to the present invention, a viscosity modifier is added to the internal phase to shorten the reversal time. If the above hypothetical composition has a viscosity modifier added to it such that the resulting reversal time is shortened to 1 second, when using the same radiation source, the modified material can polymerize. It is not completely understood why the increase in viscosity shortens the reversal time; nonetheless, the effect of viscosity on reversal time is clearly an inversely proportional relationship.

In accordance with one embodiment of the present invention, the photosensitive composition comprises an image-forming agent, a photohardenable composition comprising a free radical addition polymerizable or crosslinkable compound, a photoinitiator, and a viscosity modifier for increasing the viscosity of said internal phase. In a preferred embodiment, the photosensitive composition comprises the internal phase of pressure rupturable microcapsules.

In yet another embodiment, the present invention relates to a photosensitive material comprising a substrate having a coating containing photosensitive microcapsules on the surface thereof, the microcapsules having an internal phase as defined above.

In yet another embodiment, the present invention relates to a method for producing images. The method includes the steps of providing photosensitive microcapsules as defined above; image-wise exposing the photosensitive microcapsules to actinic radiation for a period of time longer than the reversal time of the photosensitive microcapsules; providing a receiver sheet; and subjecting the microcapsules to a uniform rupturing force to cause the image-forming agent to migrate to the receiver sheet and form an image. If the image forming agent is a colorless color-forming agent which requires the presence of a developer material to form an image, the receiver sheet is provided with such a developer material. The receiver sheet may be located remote from the microcapsules to form a transfer system or may contain the microcapsules to form a self-contained system.

Accordingly, it is an object of the present invention to provide a photosensitive composition having a shorter reversal time.

It is a further object of the present invention to shorten the reversal time of a photosensitive composition by adding a viscosity modifier to the composition.

An additional object of the present invention is to provide a photocopy system which is capable of producing photocopies at increased rates.

It is an additional object of the present invention to utilize high intensity radiation sources, such as lasers.

These, and other objects will be readily recognized and understood by one skilled in the art as references made to the following detailed description of the preferred embodiments.

BRIEF DESCRIPTION OF THE DRAWING

The FIGURE depicts an H&D curve of a photosensitive composition which exhibits short time scale reversal.

DETAILED DESCRIPTION OF THE PREFERRED EMBODIMENTS

While describing the preferred embodiments, certain terminology will be utilized for the sake of clarity. It is to be understood that such terminology includes not only the recited embodiments, but all technical equivalents which perform substantially the same function in substantially the same way to obtain the same result.

The present invention comprises photosensitive microcapsules. The microcapsules contain a photohardenable composition including a photoinitiator in the internal phase. Photohardenable compositions such as photopolymerizable and photocrosslinkable materials increase in viscosity or solidify upon exposure to radiation. Also contained in the internal phase is a viscosity modifier which can function to shorten the reversal time of the microcapsules. In association with the microcapsules is an image-forming agent.

Various radiation curable materials, photoinitiators, viscosity modifiers, and image-forming agents can be used in conjunction with the photographic materials of the present invention.

Ethylenically unsaturated organic compounds are useful radiation curable materials. These compounds contain at least one terminal ethylene group per molecule. Typically, they are liquid. Polyethylenically unsaturated compounds having two or more terminal ethylene groups per molecule are preferred. An example of this preferred subgroup is ethylenically unsaturated acid esters of polyhydric alcohols, such as trimethylolpropane triacrylate (TMPTA) and dipentaerythritol hydroxypentaacrylate (DPHPA).

Another suitable radiation sensitive composition is an acrylate prepolymer derived from the partial reaction of pentaerythritol with acrylic acid or acrylic acid esters. Photosensitive compositions based on these prepolymers having an acrylate functionality of between approximately two and three are available commercially in two-package systems from the Richardson Company, Melrose Park, Ill., such as RL-1482 and RL-1483. These are recommended to be mixed together to form a radiation curable clear varnish in a ratio of 4.4 parts of RL-1482 to one part RL-1483.

Another group of substances useful as radiation sensitive compositions include isocyanate modified acrylic, methacrylic and itaconic acid esters of polyhydric alcohols as disclosed in U.S. Pat. Nos. 3,783,151; 3,759,809 and 3,825,479, all to Carlick et al. Radiation curable compositions including these isocyanate modified esters and reactive diluents such as tetraethylene glycol diacrylate as well as photoinitiators such as chlorinated resins, chlorinated paraffins and amine photoinitiation synergist are commercially available as over print varnishes from Sun Chemical Corp., Carlstat, N.J., under the tradename of Sun Cure resins.

The radiation sensitive component of several radiation curable inks is also suitable for use in this invention. An example of this type of material is a mixture of pentaerythritol acrylate and a halogenated aromatic, alicyclic or aliphatic photoinitiator, as disclosed in U.S. Pat. No. 3,661,614 to Bessemir et al.

The photoinitiator is capable of absorbing actinic radiation and producing free radicals capable of initiating free radical polymerization of the polymerizable or crosslinkable compound. A preferred photoinitiator system for use in the present invention includes ionic dye-counter ion compounds described in European Application Publication No. 0 233 587. A preferred class of ionic dye-counter ions is cationic dye borates and still more particularly cyanine dye borates. Typically the borate is a triphenylalkyl borate such as a triphenylbutyl borate. Other dye complexes such as Rose Bengal iodonium and Rose Bengal pyryllium complexes may also be used.

Examples of other photoinitiators potentially useful in the present invention may be selected from among diaryl ketone derivatives, quinones, benzoin alkyl ethers, alkoxy phenyl ketones, O-acylated oximinoketones, polycyclic quinones, phenanthrenequinone, naphthoquinone, diisopropylphenanthrenequinone, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones and haloalkanes. In many cases it is advantageous to use a combination with imaging photoinitiators.

Initiators including the ionic dye complexes may preferably include an autoxidizer. Suitable examples include N,N,-dialkylanilines as described in the European Publication.

The internal phase also includes a viscosity modifier which functions to increase the viscosity of the internal phase. It has been found that the reversal time for a given internal phase can be significantly decreased by the addition of a material having a higher viscosity than a polymerizable or crosslinkable monomer such as TMPTA e.g., greater than 250 centipoise at 25° C. In accordance with the present invention, the viscosity modifier is added in an amount sufficient to cause the reversal time of the composition to shorten to a time wherein the composition can withstand high intensity short time scale exposures without undergoing reversal. While the mechanism is not completely understood, the viscosity modifier alters the chemical properties of the internal phase to reduce the reversal time of the composition.

The viscosity modifier may be a reactive modifier, i.e., a modifier which itself is capable of polymerizing or crosslinking, or it may be a non-reactive modifier. Examples of reactive viscosity modifiers include dipentaerythritol hydroxypentaacrylate (DPHPA) and ethoxy ethoxylated bisphenol-A diacrylate (sold under the trade name Viscoat 700). As will be understood in the art, other monofunctional or bifunctional acrylates may be added as a viscosity modifier. Non reactive modifiers include natural and synthetic waxes which are miscible with the monomer present in the internal phase and preferably have a melting point between 30° C. and 85° C. Examples of such modifiers include, but are not limited to, beeswax, hydrocarbons such as pentacosane, heptacosane, octacosane, nonacosane, hentriacosane and melene, free wax acids such as lignoceric acid, cerotic acid and melissic acid; esters of wax acids such as myricyl palmitate and ceryl 2-hydroxypalmitate; carnauba wax, Japan wax, Jojoba wax, mineral waxes, petroleum waxes such as paraffin waxes; and synthetic waxes such as polyethylene waxes and Fischer-Tropsch waxes.

The ability to which a photosensitive composition undergoes reversal as a result of short time scale failure varies from composition to composition and can only be evaluated on a case by case basis. In the preferred embodiment, the relative viscosity of the inventive composition ranges from about 350 centipoise to about 1000 centipoise at 25° C. If the inventive composition is not encapsulated, the viscosity of the composition can be even higher. In the case where the composition is encapsulated, the composition must have a low enough viscosity to enable the internal phase to exude from the interior of the microcapsule upon rupture.

Various image-forming agents can be used in association with the radiation curable composition and the viscosity modifier. For example, images can be formed by the interaction of color formers and color developers of the type conventionally used in the carbonless paper art. In addition, images can be formed by the color producing interaction of a chelating agent and a metal salt or by the reaction of certain oxidation-reduction reaction pairs, many of which have been investigated for use in pressure-sensitive carbonless papers. Alternatively, an oil soluble dye can be used and images can be formed by transfer to plain or treated paper. The internal phase itself can also have its own image-forming capability. For example, it is known that many of the toners used in xerographic recording processes selectively adhere to the image areas of an imaging sheet exposed and developed as in the present invention.

As explained in U.S. Pat. No. 4,399,209, the image-forming agent can be provided inside the microcapsules, in the microcapsule wall, or outside the microcapsules in the same layer as the microcapsules or in a different layer. In the latter cases, the internal phase picks up the image-forming agent (e.g., by dissolution) upon being released from the microcapsules and carries it to the developer layer or an associated image-receiving sheet.

Typical color precursors useful in the aforesaid embodiments include colorless electron donating type compounds. Representative examples of such color formers include substantially colorless compounds having in their partial skeleton a lactone, a lactam, a sulfone, a spiropyran, an ester or an amido structure such as triarylmethane compounds, bisphenylmethane compounds, xanthene compounds, fluorans, thiazine compounds, spiropyran compounds and the like. Crystal Violet Lactone and Copikem X, IV and XI (products of Hilton-Davis Chemical Co.) and Reakt Yellow (a product of BASF) are often used alone or in combination as color precursors in the present invention, as are commercially available cyan, magenta and yellow color forming agents.

The discrete walled microcapsules used to encapsulate the internal phase in the present invention can be produced using known encapsulation techniques including coacervation, interfacial polymerization, polymerization of one or more monomers in an oil, etc. Representative examples of suitable wall-formers are gelatin materials (see U.S. Pat. Nos. 2,730,456 and 2,800,457 to Green et al.) including gum arabic, polyvinyl alcohol, carboxy-methylcellulose; resorcinol-formaldehyde wall formers (see U.S. Pat. No. 3,755,190 to Hart et al.); isocyanate wallformers (see U.S. Pat. No. 3,914,511 to Vassiliades); isocyanate-polyol wall-formers (see U.S. Pat. No. 3,796,669 to Kiritani et al.); urea-formaldehyde wallformers, particularly urea-resorcinol-formaldehyde in which oleophilicity is enhanced by the addition of resorcinol (see U.S. Pat. Nos. 4,001,140; 4,087,376 and 4,089,802 to Foris et al.); and melamine-formaldehyde resin and hydroxypropyl cellulose (see commonly assigned U.S. Pat. No. 4,025,455 to Shackle). A melamine-formaldehyde capsule is particularly preferred as described in commonly assigned U.S. Application Ser. No. 128,292, filed Dec. 3, 1987.

The mean microcapsule size used in the present invention generally ranges from about 1 to 25 microns.

To produce an imaging sheet containing the microcapsules, the microcapsules are coated onto a substrate. The most common substrate for imaging sheets in accordance with this invention is a transparent film or paper. The paper may be a commercial impact raw stock, or special grade paper such as cast-coated paper or chrome-rolled paper. The latter two papers are preferred when using microcapsules having a diameter between approximately 1 and 5 microns because the surface of these papers is smoother and therefore the microcapsules are not as easily embedded in the stock fibers. Transparent substrates such as polyethylene terephthalate and translucent substrates can also be used in this invention. Another preferred substrate for the microcapsules is aluminized Mylar (PET). The microcapsules can be located on either the top or bottom surface of a transparent substrate to form an imaging sheet.

To produce a positive image, the substrate is imagewise exposed to actinic radiation, preferably wavelengths in either the ultraviolet, visible or infrared range. Moreover, the intensity of the radiation source must be such that the photosensitive composition does not undergo reversal (i.e., the source must be selected so that the exposure time required for polymerization exceeds the reversal time). As the inventive composition possesses a shorter reversal time, higher intensity sources can be used. Conversely, because the compositions have shorter reversal times, they can be exposed for shorter periods of time (with higher intensity sources) without reversing. A typical exposure intensity exceeds 2000 ergs/cm$^2$. sec. and may range from about 1000 ergs/cm$^2$. sec. to about 32000 ergs/cm$^2$. sec. In the preferred embodiment, high intensity light sources are used as the radiation source. Further, the exposure time typically ranges from milliseconds to seconds. Moreover, because of the shorter exposure times required for exposure, more exposures, and hence, more copies can be produced per minute. It is further envisioned that if the addition of a viscosity modifier reduces the reversal time to below a milliseconds time frame, commercially available lasers can be utilized as the light source.

After the exposure step, the microcapsules on the substrate are subjected to a uniform rupturing force in the presence of a developer material to rupture the microcapsules and form a positive image.

Where the image-forming agent is not a dye or pigment, a developer material is selected to react with the image-forming agent to form an image. Illustrative examples of color developers useful in conjunction with the embodiment employing the aforesaid color precursors are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxynaphthoate, zinc 3,5-di-tert-butyl salicylate, oil soluble metal salts or phenol-formaldehyde novolak resins (e.g., see U.S. Pat. Nos. 3,672,935; 3,732,120 and 3,737,410) such as zinc modified oil soluble phenol-formaldehyde resin as disclosed in U.S. Pat. No. 3,732,120, zinc carbonate etc. and mixtures thereof. A preferred class of glossable developers is described in commonly assigned U.S. Application Ser. No. 073,036, filed July 14, 1987.

The developer material may be located on a support separate from the imaging sheet to thereby form a transfer image coating system as described in U.S. Pat. No. 4,399,209. In such a system the imaging sheet and the developer sheet are brought together in the presence of a uniform rupturing force to cause the image-forming agent to migrate to the developer sheet and form an image on the developer sheet. The support may be made of paper, or a transparent film such as polyethylene terephthalate.

Alternatively, the developer material may be located on the same surface as the layer of microcapsules to form a self-contained sheet as described in U.S. Pat. No. 4,440,846. In this configuration, the substrate is coated with a first coating of developer material and then a second coating of the photosensitive microcapsules. Alternatively, the microcapsules and developer material can be admixed and coated as a single layer as is readily understood in the art.

By performing the above-described method, images are produced on the substrate. Moreover, as the images can be produced using higher intensity exposures for shorter periods of time, radiation sources such as commercially available lasers can be utilized. This is a clear advantage over prior art, lower viscosity internal phase materials which required lower intensity, longer exposures to produce images as higher intensity exposures would subject the prior art compounds to reversal.

The present invention may be utilized to produce monochromatic or full color images. Full-color imaging systems are described in U.S. Pat. No. 4,576,891, European Published Application No. 0223587 and U.K. Pat. No. 2,113,860. These systems employ imaging sheets having three sets of microcapsules which respectively contain cyan, magenta and yellow color precursors. As explained in more detail in the above-listed references, each set of microcapsules is primarily sensitive in a different wavelength band such that the microcapsules can be individually exposed with minimum cross-talk. In panchromatic systems, the cyan, magenta, and yellow forming photosensitive microcapsules are respectively sensitive to red, green and blue light.

In accordance with the present invention, at least one of the three sets of microcapsules preferably contains a photohardenable composition including a viscosity modifier. Further, for each set of microcapsules, the composition selected is sensitive to a different wavelength band. For color forming microcapsules which do not exhibit short time scale reciprocity failure under typical operating conditions, no viscosity modifiers need to be added to the respective internal phases.

To produce full-color images, each set of microcapsules is image-wise exposed to actinic radiation. This requires exposures of three different wavelengths, each wavelength corresponding to the sensitivity of the photohardenable composition selected for the corresponding set of microcapsules. The three different wavelengths may be provided from one broad band radiation source or three independent monochromatic radiation sources.

In a panchromatic system, it is envisioned that green, blue, and red lasers may be used for the exposures. These processes rely upon image process techniques which are well known in the art. It is further contemplated that a high intensity white light source containing at least three distinct bands of actinic radiation may be used for the short term exposures. Because of the presence of the viscosity modifiers, as discussed above, the materials are able to withstand high intensity, short term exposures without undergoing reversal (as long as the exposure time to effectuate radiation for a source of a given intensity exceeds the reversal time of the composition).

After exposure, the substrate is brought into contact with a developer material, and the microcapsules are ruptured in the presence of the developer material to produce a full color image.

The invention is illustrated in more detail by the following non-limiting examples:

EXAMPLE 1

The following internal phase was encapsulated in melamine-formaldehyde microcapsules and coated on 3 mil polyethylene terephthalate film:

| | |
|---|---|
| Trimethylolpropane Triacrylate (TMPTA) | 100 parts |
| 1,1'-di-n-heptyl-3,3,3',3'-tetramethylindodi-carbocyanine triphenyl-n-butylborate | .2 parts |
| Diisopropyl Dimethylamine (DIDMA) | 6 parts |
| Cyan Color Former (Hilton Davis HD-5430) | 12.0 parts |
| Desmodur N-100 Isocyanates | 6.6 parts |

The viscosity of the composition was 100 centipoise at 22° C. To determine the reversal time of the composition, the composition was exposed to light through a step wedge at a distance of 19 cm using a 350 watt tungsten bulb and brought into contact with a developer material. The reversal time determined was 4 seconds.

EXAMPLES 2-7

The experiment of Example 1 was repeated with the exception that a portion of the TMPTA was substituted with Dipentaerythritol hydroxypentaacrylate (DPHPA) a highly viscous polymerizable monomer. The viscosity of DPHPA was approximately 10,000 cps, as reported by a Haake Viscometer at approximately 20° C. The ratio of TMPTA to DPHPA, viscosity of the internal phase (expressed in log units), and reversal time is shown in Table 1.

TABLE 1

| Example | Ratio of TMPTA/DPHPA | log Viscosity (Centipoise) at 22° C. | Reversal Time |
|---|---|---|---|
| 1 | 100/0 | 2.00 | 4 seconds |
| 2 | 80/20 | 2.30 | 2 seconds |
| 3 | 75/25 | 2.58 | 1 seconds |
| 4 | 70/30 | 2.71 | .5 seconds |
| 5 | 60/40 | 2.85 | .25 seconds |
| 6 | 50/50 | 2.90 | .12 seconds |
| 7 | 40/60 | 3.00 | <.06 seconds |

EXAMPLE 8

As a control, the following internal phase was encapsulated in melamine-formaldeyde microcapsules and coated on polyethylene terephthalate film:

| | |
|---|---|
| TMPTA | 150 parts |
| 1,1'-di-n-heptyl-3,3,3',3'-tetramethyl-indodicarbocyanine triphenyl-n-butyl borate | .9 parts |
| Hilton Davis HD-5100 | 32 parts |
| DIDMA | .5 parts |
| Desmodur N-100 Isocyanates | 10 parts |

The composition was exposed to a white light having an intensity of 68390 lm/m$^2$ at a distance of 13.5 centimeters. The reversal time determined was 0.5 seconds.

EXAMPLE 9

The experiment of Example 3 was repeated with the exception that instead of 150 parts of TMPTA, the internal phase included 105 parts of TMPTA and 45 parts of octacosane. The reversal time determined was .12 seconds.

As is demonstrated in the above examples, the increase in viscosity in the internal phase clearly reduced the reversal time of the composition. This acts to limit the risk of reversal as a result of short time scale reprocity failure and enables the production of images at significantly faster rates than previously available.

This enables the inventive system and method to be industrially suitable for high speed copiers, and particularly those using high intensity sources as radiation sources.

Having described the invention in detail and by reference to the preferred embodiments thereof, it will be apparent that modifications and variants are possible without departing from the scope of the appended claims.

What is claimed is:

1. A method for producing images comprising the steps of:
providing a substrate having front and back surfaces, said substrate having a coating comprising photosensitive microcapsules located on either of said front or back surfaces, said microcapsules having an internal phase containing an image-forming agent, a photohardenable composition comprising a free radical addition polymerizable or crosslinkable compound, a photoinitiator comprising an ionic dyereactive counter ion compound, and a viscosity modifier being a different compound than said free radical addition polymerizable or crosslinkable compound, wherein the presence of said viscosity modifier in said internal phase has the effect of shortening the reversal time of said photosensitive microcapsules;
image-wise exposing said photosensitive microcapsules to actinic radiation of an intensity exceeding about 2000 ergs/cm$^2$ sec; and subjecting said microcapsules to a uniform rupturing force to enable said image-forming agent to form an image.

2. The method according to claim 1 comprising the additional step of:
providing a developer material capable of reacting with said image-forming agent to form an image;
wherein said subjecting said microcapsules to a uniform rupturing force step comprises rupturing said microcapsules in the presence of said developer material.

3. The method according to claim 2 wherein said image-wise exposing step comprises exposing said microcapsules to radiation having an intensity between about 2000 ergs/cm$^2$. sec. and about 32000 ergs/cm$^2$. sec.

4. The method according to claim 2 wherein said method is capable of producing full color images and wherein said photosensitive microcapsules comprises three sets of microcapsules.

5. The method according to claim 4 wherein said three sets of microcapsules comprise a first set of microcapsules containing a cyan color-forming agent, a second set of microcapsules containing a magenta color-forming agent and a third set of microcapsules containing a yellow color-forming agent.

6. The method according to claim 5 wherein said image-wise exposing step comprises exposing said three sets of microcapsules to radiation emitted from a broad band visible light source.

7. The method according to claim 1 wherein said photoinitiator comprises a cyanine dye borate.

8. The method according to claim 1 wherein said viscosity modifier comprises a compound capable of polymerizing or crosslinking by free radical addition polymerization.

9. The method according to claim 8 wherein said viscosity modifier is selected from the group consisting of dipentaerythritol hydroxypentaacrylate and ethoxy ethoxylated bisphenol A discrylate.

10. The method according to claim 9 wherein said viscosity modifier comprises dipentaerythritol hydroxypentaacrylate.

11. The method according to claim 1 wherein said viscosity modifier comprises a non-reactive modifier.

12. The method according to claim 11 wherein said viscosity modifier is selected from the group consisting of beeswax, hydrocarbon waxes, free wax acids, esters of wax acids, carnauba wax, Japan wax, Jojoba wax, mineral waxes, petroleum waxes and synthetic waxes.

13. The method according to claim 2 wherein said free radical addition polymerizable or crosslinkable compound is trimethylolpropane triacrylate.

14. The method according to claim 1 wherein said photosensitive microcapsules ar exposed to actinic radiation of an intensity exceeding about 2000 ergs/cm$^2$. sec for a period of time longer than the reversal time.

* * * * *